(12) United States Patent
Belot et al.

(10) Patent No.: US 7,868,517 B2
(45) Date of Patent: Jan. 11, 2011

(54) LAMB WAVE RESONATOR

(75) Inventors: Didier Belot, Rives (FR); Andreia Cathelin, Laval (FR); Alexandre Augusto Shirakawa, Bordeaux (FR); Jean-Marie Pham, Merignac (FR); Pierre Jary, Talence (FR); Eric Kerherve, Talence (FR)

(73) Assignees: STMicroelectronics S.A., Montrouge (FR); Centre National de la Recherche Scientifique, Paris Cedex (FR)

( * ) Notice: Subject to any disclaimer, the term of this patent is extended or adjusted under 35 U.S.C. 154(b) by 272 days.

(21) Appl. No.: 12/255,426

(22) Filed: Oct. 21, 2008

(65) Prior Publication Data

US 2009/0102316 A1    Apr. 23, 2009

(30) Foreign Application Priority Data

Oct. 22, 2007    (FR)    .................................. 07 58470

(51) Int. Cl.
  *H01L 41/04*    (2006.01)
(52) U.S. Cl. ................. 310/313 R; 310/313 B
(58) Field of Classification Search .................. 310/313
  See application file for complete search history.

(56) References Cited

U.S. PATENT DOCUMENTS

| | | | | |
|---|---|---|---|---|
| 3,887,887 A | * | 6/1975 | Wagers et al. | 333/151 |
| 3,931,598 A | * | 1/1976 | Bongianni | 333/150 |
| 4,388,600 A | * | 6/1983 | Wakino et al. | 333/151 |
| 4,595,853 A | * | 6/1986 | Nagatsuma et al. | 310/313 D |
| 4,598,261 A | * | 7/1986 | Ballato | 333/195 |
| 4,634,914 A | * | 1/1987 | Ballato | 310/313 D |
| 5,345,134 A | * | 9/1994 | Greer | 310/313 D |

(Continued)

FOREIGN PATENT DOCUMENTS

JP    2005217818 A * 8/2005

(Continued)

OTHER PUBLICATIONS

Bjurstrom et al. *Thin Film Lamb Wave Resonant Structure- The First Approach*, Solid State Electronics, Elsevier Science Publishers, Barking GB, vol. 50, n3, Mar. 2006, pp. 322-326.

(Continued)

*Primary Examiner*—J. SanMartin
(74) *Attorney, Agent, or Firm*—Lisa K. Jorgenson; Allen, Dyer, Doppelt, Milbrath & Gilchrist, P.A.

(57) ABSTRACT

A Lamb wave resonator includes a piezoelectric layer, and a first electrode against a first face of the piezoelectric layer. The first electrode includes fingers and a contact arm, with each finger including a first side in contact with the contact arm and two other sides parallel to one another. Portions of the piezoelectric layer are at least partially etched between the two fingers to form a recess. The fingers are spaced apart from one another by a distance W calculated according to the following equation:

$$W = n \cdot \frac{va_{lateral}}{f}, \text{ with } n \in N$$

where,
$va_{lateral}$ is an acoustic propagation speed of Lamb waves,
n is an order of a resonance mode of the Lamb waves,
f is a resonance frequency of the Lamb wave resonator.

30 Claims, 5 Drawing Sheets

U.S. PATENT DOCUMENTS

| | | | |
|---|---|---|---|
| 6,445,265 B1 * | 9/2002 | Wright | 333/193 |
| 7,148,769 B2 * | 12/2006 | Takano | 333/193 |
| 7,453,184 B2 * | 11/2008 | Kando | 310/313 R |
| 7,535,152 B2 * | 5/2009 | Ogami et al. | 310/313 A |
| 7,665,196 B2 * | 2/2010 | Lee et al. | 29/25.35 |
| 7,716,986 B2 * | 5/2010 | Sung et al. | 73/584 |
| 2006/0076852 A1 | 4/2006 | Ruile et al. | 310/313 |
| 2006/0152107 A1 | 7/2006 | Tanaka | 310/313 |
| 2009/0206955 A1 * | 8/2009 | Iizawa | 333/195 |
| 2010/0043191 A1 * | 2/2010 | Kadota et al. | 29/25.35 |
| 2010/0181868 A1 * | 7/2010 | Gaidarzhy et al. | 310/313 B |

FOREIGN PATENT DOCUMENTS

WO    2004/1099123    12/2004

OTHER PUBLICATIONS

M. Desvergne et al. *Intermediate Frequency Lamb Wave Coupled Resonator Filters for RF Receiver Architectures*, 37th European Solid State Device Research Conference. Sep. 2007, pp. 358-361.

Yasuhiko Nakagawa et al. *Resonators Using a Lamb Wave on AT-Cut Quartz*, Japanese Journal of Applied Physics, vol. 46, n7b, Jul. 2007, pp. 4665-4668.

R. Ruby et al. *The Effect of Perimeter Geometry on FBAR Resonator Electrical Performance*, Microwave Symposium Digest, 2005 IEEE MTT-S International Long Beach, CA, Jun. 2005, pp. 217-220.

A. Volatier et al. *UHF/VHF Resonators Using Lamb Waves Co-Integrated with Bulk Acoustic Wave Resonator*, IEEE Ultrasonics Symposium, 2005, pp. 902-905.

* cited by examiner

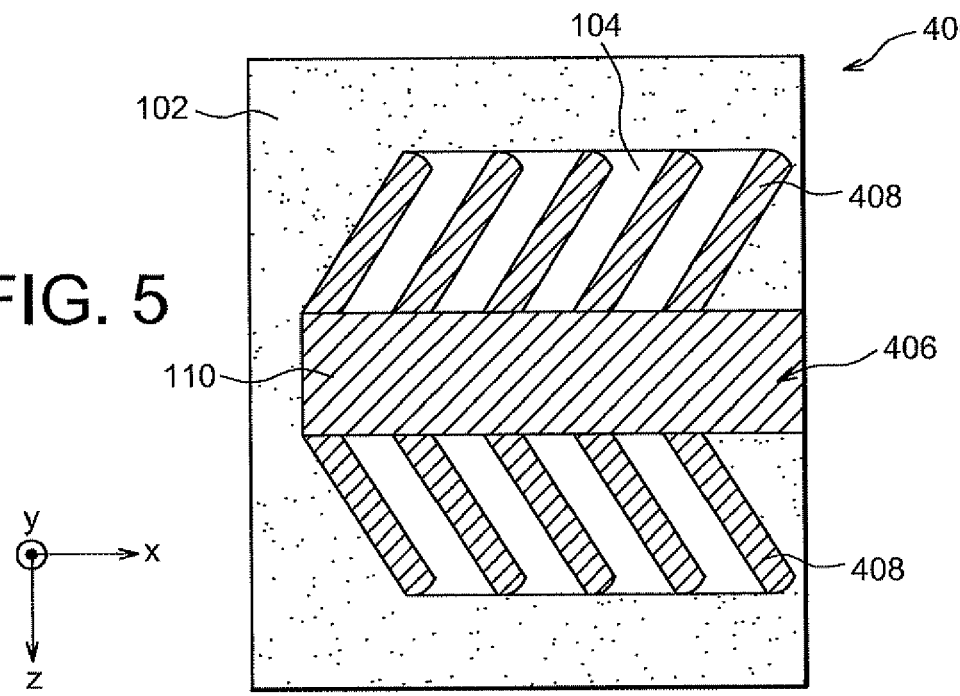
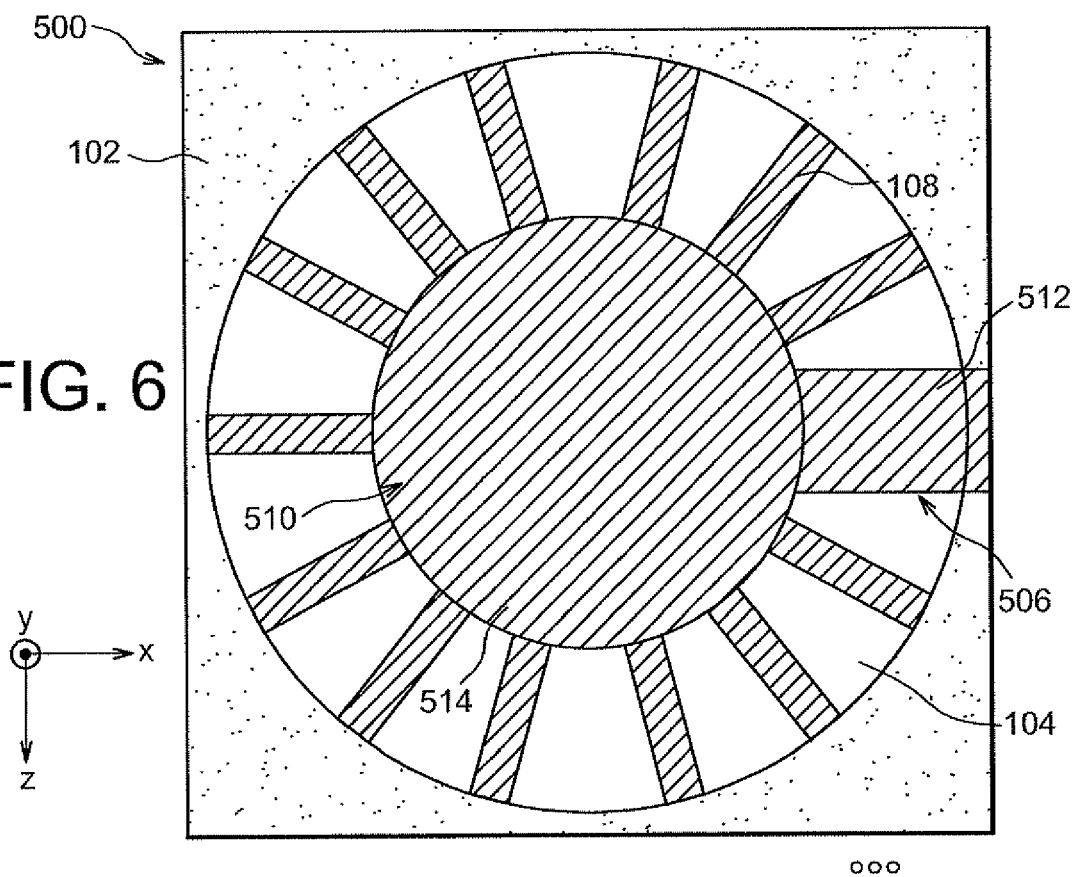

LAMB WAVE RESONATOR

FIELD OF THE INVENTION

The present invention relates to the field of resonators, as well as to the field of filters obtained from Lamb wave resonators. These filters may be used in RF (radio frequency) transmission and/or reception structures, such as mobile communication devices, to perform channel filtering or intermediate frequency filtering, for example.

BACKGROUND OF THE INVENTION

To perform RF filtering, SAW (surface acoustic wave) filters may be used, which are produced by coupled SAW resonators. Typically, for such a filter with dimensions equal to about 3 mm×3 mm×1 mm, the insertion losses can be between 2.5 dB and 3 dB with a rejection equal to about 30 dB. However, these filters have limitations. The maximum resonance frequencies are generally equal to about 3 GHz, and the maximum power handling is equal to about 1 W. Outside of this range of operation, SAW devices have significant propagation losses.

BAW (bulk acoustic wave) filters may be produced from piezoelectric BAW resonators coupled electrically (with a ladder or a lattice structure, for example) or acoustically (of the (SCF) Stacked Crystal Filter type or the (CRF) Coupled Resonator Filter type). In such a filter, the signal to be filtered is propagated vertically in stacked resonant layers, directly or by an acoustic propagation medium, one on top of another. The dimensions and insertion losses capable of being obtained with these BAW filters are comparable to those of the SAW filters. However, the power handling of these BAW filters can reach about 3 W and the maximum resonance frequencies can be greater than about 16 GHz. Finally, the production of these filters is compatible with CMOS and BiCMOS technologies.

FIG. 1 shows an example of a BAW resonator 1 comprising a layer 2 based on a piezoelectric material, a lower electrode 4 and an upper electrode 6. The dimensions of the lower electrode 4 and the piezoelectric layer 2 are substantially similar to one another in a plane parallel to plane (x, z) based axes x and z shown in FIG. 1. The lower electrode 4 is then completely covered by the piezoelectric layer 2. In contrast, the upper electrode 6 has a shape and dimensions different from those of the lower electrode 4.

In the example of FIG. 1, the upper electrode 6 has a dimension according to axis x that is smaller than that of the lower electrode 4. This difference in dimensions between the lower electrode 4 and the upper electrode 6 forms two zones in the piezoelectric layer 2. A first active zone 8 is the piezoelectric layer 2 contained between the two electrodes 4 and 6. A second inactive zone 10 is the piezoelectric layer 2 arranged on the lower electrode 4 without being covered by the upper electrode 6. The speed of propagation of the waves in the active zone 8 is different from that in the inactive zone 10. This difference in propagation speed results in parasitic resonances due to the propagation of lateral waves perpendicular to the vertical waves, called Lamb waves. The energy of the Lamb waves is proportional to the value of the difference between the bulk acoustic propagation coefficients (propagation according to axis y) of the active zone 8 and the inactive zone 10.

U.S. published patent application no. 2006/0076852 describes electroacoustic components using bulk acoustic waves. Electrodes are positioned periodically on a piezoelectric layer so as to guide the bulk acoustic waves into the component. The value of the piezoelectric coefficient of this layer at the level of the electrodes is different from that at the level of the portions of the layer not covered by the electrodes. This difference with regard to the propagation coefficient in the piezoelectric layer is difficult to obtain and requires specific steps of treating the piezoelectric layer.

The article "UHF/VHF resonators using Lamb waves co-integrated with Bulk Acoustic Wave resonators" by A. Volatier et al., IEEE Ultrasonics Symposium, 2005, pages 902 to 905, describes Lamb wave resonators comprising a square or rectangular electrode. The order of the resonance mode is chosen according to the resonance frequency desired. These resonators have, in particular, the disadvantages of having a relatively low quality factor and a high series resistance.

SUMMARY OF THE INVENTION

In view of the foregoing background, an object of the present invention is to provide a Lamb wave resonator of which the shape makes it possible to effectively use the resonance energy of the Lamb waves, while having a high quality factor and a low series resistance by comparison with known resonators, and the production of which may not require a specific step of treating the piezoelectric layer.

This and other objects, advantages and features in accordance with the present invention are provided by a Lamb wave resonator comprising at least one layer based on at least one piezoelectric material, and a first electrode placed against a first face of the piezoelectric layer, and of which the pattern, in a plane parallel to the plane of the first face of the piezoelectric layer, comprises at least two fingers and a contact arm. Each of the fingers may comprise a first side in contact with the arm, and two other sides parallel to one another and spaced apart from one another by a distance W calculated according to the equation:

$$W = n \cdot \frac{va_{lateral}}{f}, \text{ with } n \in N$$

$va_{lateral}$: acoustic propagation speed of the Lamb waves,
n: order of the resonance mode of the Lamb waves, and
f: resonance frequency of the resonator.

Portions of the piezoelectric layer at a surface level of the plane of the first face thereof, are at least partially etched between the fingers of the first electrode.

Therefore, the width of the fingers forming a portion of the upper electrode of the resonator is sized according to the desired resonance frequency, the desired order of the resonance mode and the acoustic propagation speed measured or calculated in the resonator.

Thus, with such a resonator comprising fingers of which the width W is thus calculated, the resonance energy of the Lamb waves generated in the resonator is best used. Moreover, the quality factor may thus be increased and the series resistance of the resonator may be reduced with respect to the known devices.

Such a resonator with a high quality factor makes it possible, in particular, to produce voltage control oscillators with a very low phase noise and low consumption, intermediate frequency filters (between about 10 MHz and 200 MHz) with low insertion losses and high selectivity, and band-pass sigma-delta modulators with a very high rejection and very low consumption. In general, these advantages are found in any type of device using at least one such resonator in the intermediate frequency band.

In addition, the density of the piezoelectric material may be reduced at the level of the inactive zones of the resonator located between the fingers of the first electrode by at least partial etching of portions of the piezoelectric layer located between the fingers of the first electrode. These etched portions may create a discontinuity of the conditions for acoustic propagation between the active zones of the piezoelectric layer located at the level of the fingers of the first electrode, and the inactive zones of the piezoelectric layer located between the fingers of the first electrode. This discontinuity may modify the acoustic transmission parameters in the piezoelectric layer, thus making it possible to confine the acoustic resonance energy in the active zone(s) of the resonator.

Thus, it is not necessary to implement a specific treating step of the piezoelectric layer, but only one or more etching steps that may be common to the etching of other elements of the resonator. The portions of the piezoelectric layer may be etched in the plane of the first face of the piezoelectric layer according to a pattern comprising a plurality of holes.

As an alternative, the portions of the piezoelectric layer may be entirely etched. The portions may be etched through, between the first face of the piezoelectric layer and a second face, opposite the first face, of the piezoelectric layer.

The resonator may also comprise a second electrode arranged against a second face, opposite the first face, of the piezoelectric layer. The surface of the fingers of the first electrode in the plane parallel to the plane of the first face of the piezoelectric layer may be included in the surface formed by the second electrode in the same plane.

The second electrode may comprise, in the plane parallel to the plane of the first face of the piezoelectric layer, a pattern comprising at least two fingers and a contact arm, in which the surface of the fingers of the second electrode in the plane parallel to the plane of the first face of the piezoelectric layer may be similar and superimposed on the surface formed by the fingers of the first electrode in said same plane.

The pattern of the second electrode may be similar to the pattern of the first electrode in the plane parallel to the plane of the first face of the piezoelectric layer. The surface of the contact arm of the second electrode in the plane parallel to the plane of the first face of the piezoelectric layer may not be superimposed on the surface of the contact arm of the first electrode in said same plane.

Each finger of the first electrode may be substantially rectangular. The first electrode may comprise between 2 and 100 fingers, and preferably at least 4 fingers. The contact arm of the first electrode may be substantially rectangular.

A line parallel to the two sides of each finger of the first electrode, spaced apart from one another by a distance W may be substantially perpendicular to a line passing through a side of the contact arm of the first electrode to which the finger is connected.

The fingers of the first electrode may be connected to a single side, or to two opposite sides, or to three sides, of the contact arm of the first electrode. As an alternative, the contact arm of the first electrode may comprise at least a portion with a substantially circular shape, to which the fingers are connected.

Another aspect is directed to a method for producing a Lamb wave resonator comprising at least one step of producing a first electrode against a first face of a layer based on at least one piezoelectric material, of which the pattern, in a plane parallel to the plane of the first face of the piezoelectric layer, comprises at least two fingers and a contact arm. Each of the fingers may comprise a first side in contact with the arm, and two sides parallel to one another and spaced apart from one another by a distance W calculated according to the equation:

$$W = n \cdot \frac{va_{lateral}}{f}, \text{ with } n \in N$$

$va_{lateral}$: acoustic propagation speed of the Lamb waves,
n: order of the resonance mode of the Lamb waves, and
f: resonance frequency of the resonator.

The method may further comprise at least one step of at least partially etching portions of the piezoelectric layer at the level of the plane of the first face of the piezoelectric layer, of which the surface is located between the fingers of the first electrode.

The method may also comprise, for example, after the step of producing the first electrode, a step of producing a second electrode against a second face, opposite the first face, of the piezoelectric layer.

BRIEF DESCRIPTION OF THE DRAWINGS

This invention can be better understood on reading the following description of example embodiments provided purely for illustrative and non-limiting purposes in reference to the appended drawings in which.

DETAILED DESCRIPTION OF THE PREFERRED EMBODIMENT

Identical, similar or equivalent parts of the various figures described below have the same numeric references for consistency between the figures. The various parts shown in the figures are not necessarily shown according to the same scale, so as to make the figures easier to read. The various possibilities (alternatives and embodiments) are to understood as being non-exclusive of one another, and can be combined with one another.

Figure 1:
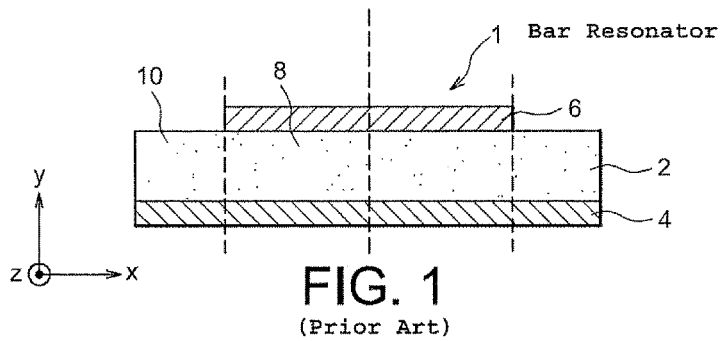
FIG. 1 shows a BAW resonator according to the prior art.
Figure 2A:
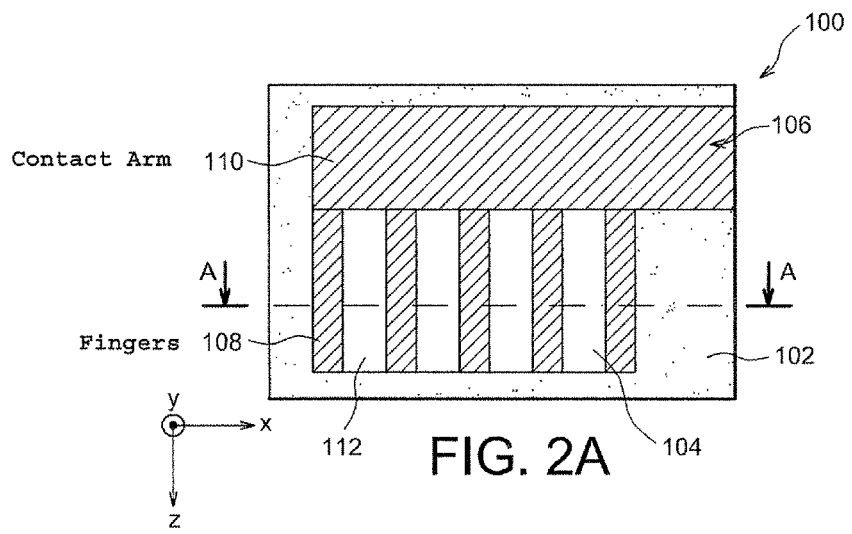
FIGS. 2A and 2B show, respectively, a top view and a cross-section view of a Lamb wave resonator according to a first embodiment of the present invention,
FIGS. 3 to 6 respectively show top views of Lamb wave resonators according to a second, third, fourth and fifth embodiment, respectively, of the present invention,
FIGS. 7A and 7B respectively show a top view and a cross-section view of a Lamb wave resonator according to a sixth embodiment of the present invention, and
FIGS. 8A and 8B respectively show a top view and a cross-section view of a Lamb wave resonator according to an alternative of the first embodiment of the present invention.
Figure 2B:
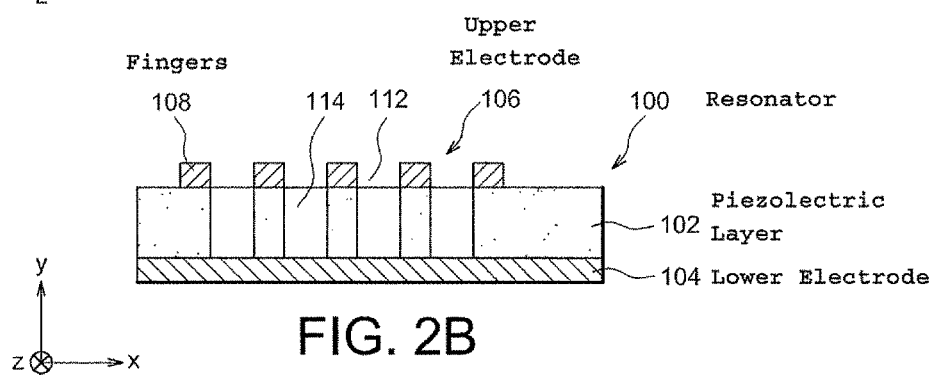

Reference is first made to FIGS. 2A and 2B, which respectively show a top view and a cross-section view according to axis AA as shown in FIG. 2A, of a Lamb wave resonator 100 according to a first embodiment.

This resonator 100 comprises a layer 102 based on a piezoelectric material. Preferably, this piezoelectric material is aluminum nitride and/or zinc oxide and/or PZT. The piezoelectric layer 102 has a thickness of which the value is dependent on the embodiments as well as the shape and dimensions of the other elements of the resonator 100 (themselves dependent on the desired coupling coefficient K of the resonator). The thickness of the piezoelectric layer 102 may in particular be between about 1 μm and 2 μm. The piezoelectric layer 102 is arranged on a lower electrode 104 visible in FIG. 2B. In this case, the shape and dimensions of the piezoelectric layer 102 in a plane parallel to plane (x, z) are substantially similar to those of the lower electrode 104 in the same plane.

The resonator 100 also comprises another electrode, called an upper electrode 106, produced on the piezoelectric layer 102. This upper electrode 106 comprises a plurality of fingers 108 connected to a contact arm 110. In this first embodiment, the upper electrode 106 comprises five fingers 108. The contact arm 110 and the lower electrode 104 are used as electrical contacts of the resonator 100. The upper electrode 106, i.e., the contact arm 110 and the fingers 108, has for example, a thickness of between about 0.1 µm and 1 µm.

The contact arm 110 in this case has a length (dimension according to axis x of FIG. 2A) and a width (dimension according to axis z of FIG. 2A) between about 1 µm and 300 µm. A contact arm 110 of which the width is greater than the length makes it possible to increase the quality factor of the resonator 100 while reducing the resistance of the contact arm 110, and therefore, the series resistance of the resonator 100. In this first embodiment, the length and the width of the piezoelectric layer 102 and the lower electrode 104 are adapted so that the surface of the upper electrode 106, in the plane (x, z), is included in that of the lower electrode 104 or of the piezoelectric layer 102 in the same plane.

The electrodes 104 and 106 may be produced conventionally by PVD (physical vapor deposition), for example of platinum and/or aluminum, and or molybdenum and/or tungsten, and then plasma etching.

The fingers 108 form areas of discontinuity 112 of the upper electrode 106 on the piezoelectric layer 102, which areas of discontinuity 112 are separated by the fingers 108. In this first embodiment, the fingers 108 each have a rectangular shape of which the width W, i.e., the dimension according to axis x, is calculated according to the following equation:

$$W = n \cdot \frac{va_{lateral}}{f}, \text{ with } n \in N$$

This dimension W therefore represents the distance between two areas of discontinuity 112 of the upper electrode 106 on the piezoelectric layer 102.

"$va_{lateral}$" represents the acoustic propagation speed of the Lamb waves. This speed is proportional to the geometric and resonance parameters of the material of the layer 102, as well as the acoustic properties of the electrodes 104, 106 and more generally of the resonator 100.

"n" represents the acoustic distance between two areas of discontinuity 112 of the upper electrode 106 separated by a finger 108, i.e., the order of the resonance mode of the Lamb waves in the resonator 100.

"f" represents the resonance frequency of the resonator 100. The maximum value of this resonance frequency f is dependent on the minimum width of the fingers 108 possible, corresponding to the value of the technological node in which the resonator 100 is produced. If the resonator 100 is produced in 35 nm technology, this minimum width is equal to 35 nm, corresponding for the resonator to a maximum resonance frequency f equal to several hundred MHz, i.e., below 1 GHz.

Therefore, the fingers 108 are sized by calculating, on the basis of the resonance properties of the layer 102, the shape of the layer 102 and the electrodes 104, 106, and the acoustic propagation speed of the Lamb waves $va_{lateral}$. According to the propagation mode and the resonance frequency desired, it is therefore possible to calculate W and thus to size the fingers 108 of the upper electrode 106. The width W of the fingers 108 is, for example, equal to 1 µm, or between about 1 µm and 100 µm and the length of these fingers 108 is, for example, between about 10 µm and 50 µm. In addition, the space between the fingers 108 is, for example, between about 1 µm and 10 µm.

Finally, in this first embodiment, the fingers 108 form, with the contact arm 110, a comb pattern. The fingers 108 form rectangles arranged perpendicularly to the contact arm 110, also with a substantially rectangular shape, i.e., a line parallel to the two sides of a finger 108 spaced apart from one another by a distance W is perpendicular to the line passing through the side of the contact arm 110 to which the finger 108 is connected.

The portions of the piezoelectric layer 102 located between a finger 108 of the upper electrode 106 and the lower electrode 104 form the active zones of the resonator 100. Between these active zones, i.e., at the level of the areas of discontinuity 112, the portions of the piezoelectric layer 102 are etched through the layer 102. As shown in FIG. 2A, this etching forms recesses 114 in the piezoelectric layer 102, between the fingers 108. These recesses 114 form the inactive zones of the resonator 100.

In the resonator 100, it is the symmetric Lamb waves of the mode $S_0$ that contribute primarily to obtaining the desired resonance. The energy of the Lamb waves is proportional to the difference between the speed of propagation of these waves in the active zones of the piezoelectric layer 102, i.e., the zones of the piezoelectric layer 102 located between a finger 108 of the upper electrode 106 and the lower electrode 104, and the propagation speed of these waves in the inactive zones of the piezoelectric layer 102, i.e., at the level of the recesses 114 formed in the piezoelectric layer 102 between the fingers 108. The lower n is chosen to be (for example n=1 for the basic mode), the higher is the resonance energy obtained on finger 108 will be.

The recesses 114 formed in the piezoelectric layer 102 make it possible to obtain very different propagation conditions, in particular acoustic impedance and propagation speed, between the active zones and the inactive zones of the resonator. The acoustic propagation coefficient in the inactive zones is therefore lower than the acoustic propagation coefficient in the active zones, which makes it possible to confine the propagation energy at the level of the active zones of the resonator.

By acoustically coupling two resonators 100 as described above, a resonant filter is therefore obtained, making it possible to obtain a high resonance at the level of the parasitic resonance frequencies $f_k=k*f$ with k being a natural non-zero integer and f being the resonance frequency of the filter 100.

Figure 3:
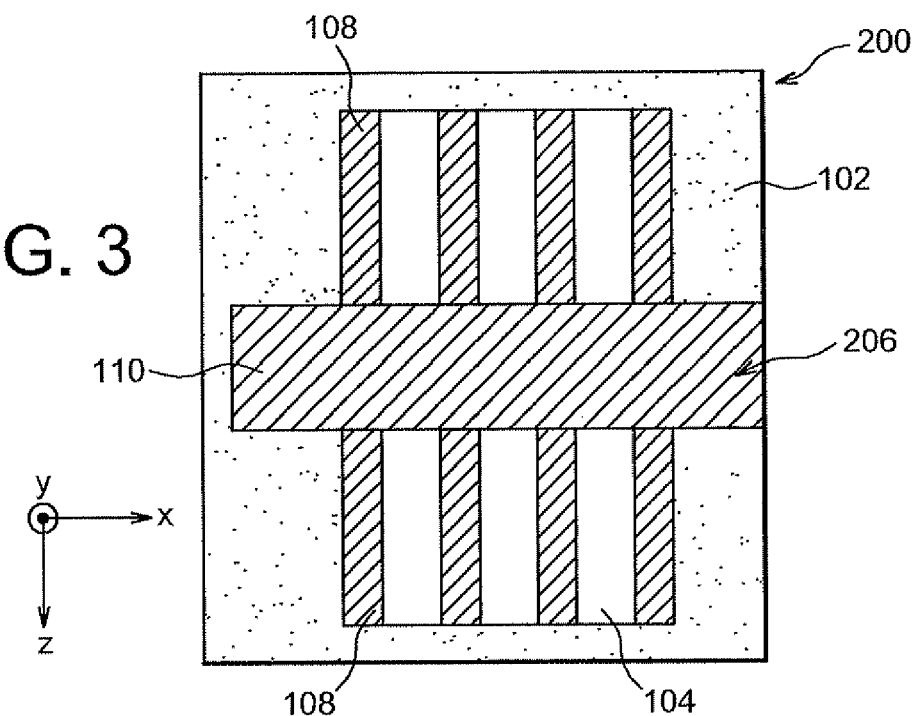

FIG. 3 shows a Lamb wave resonator 200 according to a second embodiment. With respect to the upper electrode 106 of the resonator 100 according to the first embodiment, the upper electrode 206 of this resonator 200 comprises eight fingers 108, capable, for example, of being substantially similar in shape to the fingers 108 of FIGS. 2A and 2B. Four of these fingers 108 are connected to a first side of the contact arm 110, which may also be similar to the contact arm 110 of the first embodiment, and the four other fingers 108 are connected to a second side, opposite the first side, of the contact arm 110. The fingers 108 form rectangles arranged perpendicularly to the contact arm 110, i.e., a line parallel to the two sides of a finger 108 spaced apart from one another by a distance W is perpendicular to the line passing through the side of the contact arm 110 to which the finger 108 is connected.

Figure 4:
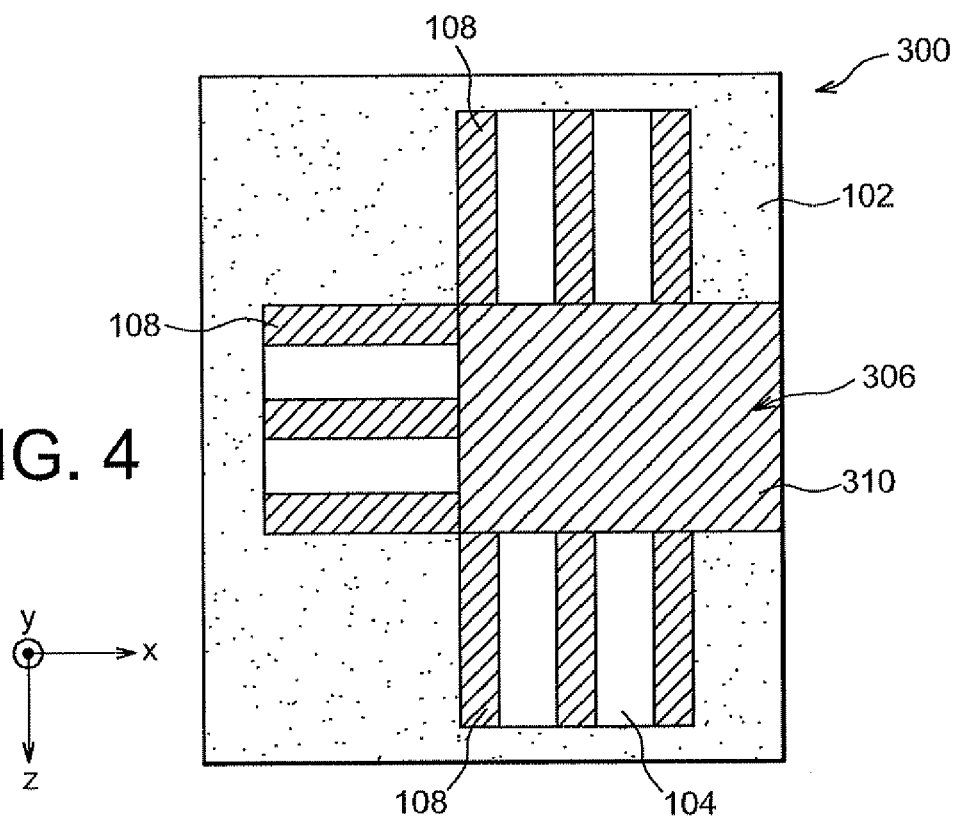

FIG. 4 shows a Lamb wave resonator 300 according to a third embodiment. With respect to the previous resonators, the upper electrode 306 of this resonator 300 comprises nine fingers 108, in which each finger may have a shape substantially similar to that of the fingers 108 of the first and second embodiments. Three of these fingers 108 are connected to a first side of a contact arm 310. With respect to the contact arm 110 of the first two embodiments, the dimensions of this contact arm 310 in plane (x, z) are between about 1 μm and 400 μm. Three other fingers 108 are connected to a second side, opposite the first side, of the contact arm 310. Finally, three other fingers 108 are connected to a third side of the contact arm 310. The third side is perpendicular to the first and second sides of the contact arm 310.

FIG. 5 shows a Lamb wave resonator 400 according to a fourth embodiment. With respect to the previous resonators, an upper electrode 406 of the resonator 400 comprises a contact arm 110 similar to the contact arm 110 of the first two embodiments. The upper electrode 406 also comprises ten fingers 408 in contact with the arm 110. With respect to the fingers 108 of the previous embodiments, the fingers 408 do not have a rectangular shape. But, like fingers 108, fingers 408 comprise two parallel sides spaced apart from one another by a distance W calculated in a manner similar to that of the previous embodiments. These two sides are in contact with a side of the arm 110. In this fourth embodiment, a line parallel to the two sides is not perpendicular to a line passing through the side of the arm 110 to which the finger 408 is connected. In this case, each finger 408 comprises a free end with a rounded shape. Finally, as can be seen in FIG. 5, the fingers 408 are arranged in a "herringbone" pattern with respect to the contact arm 110.

With respect to the first embodiment, the resonators 200, 300 and 400 make it possible, for the same active surface, i.e., the surface covered by the fingers 108 of the upper electrode 206, 306 and 406, to have finger lengths shorter than those of the fingers 108 of the upper electrode 106 of the resonator 100. This reduces their access resistances, and therefore the series resistance of the resonator. In addition, the reduction of the length of the fingers 108 makes it possible to reduce the inductive effect on the operation of the resonator.

A Lamb wave resonator 500 according to a fifth embodiment is shown in FIG. 6. With respect to the resonators described above, this resonator 500 comprises an upper electrode 506 of which the contact arm 510 includes a portion 512 with a substantially rectangular shape connected to a portion 514 with a substantially circular shape. The upper electrode 506 also comprises thirteen fingers 108, for example similar to the fingers 108 of the first, second and third embodiments. These thirteen fingers 108 are connected to the circular portion 514 of the arm 510 and distributed regularly around the circular portion.

In the FIG. 6, the fingers 108 are not arranged parallel to one another, i.e., the two sides spaced apart from one another by a distance W of a first finger 108 are not parallel to the two sides spaced apart from one another by a distance W of a second finger 108 located next to the first finger 108. In the example of FIG. 6, the axes of symmetry of the fingers 108, parallel to the sides spaced apart by a distance W, are in this case aligned with diameters of the circle formed by the circular portion 514 of the upper electrode 506.

With respect to the resonator 100 according to the first embodiment, such a resonator 500 also makes it possible to reduce the access resistances of the fingers 108 of the first electrode 506 owing to their lengths, which are shorter than those of the fingers 108 of resonator 100. Moreover, the access resistances are in this case identical for all of the fingers 108. This fifth embodiment also makes it possible to maximize the number of fingers 108 for a same surface occupied on the piezoelectric layer 102. Finally, this structure does not generate an inductive effect, which is an advantage in particular when the resonator 500 operates at high frequencies, i.e., several hundred MHz.

As an alternative to the various embodiments described above, it is possible to produce an etching not passing through in the inactive zones of the piezoelectric layer, i.e., in the zones of the piezoelectric layer not covered by a finger of the upper electrode, located between the fingers of the upper electrode.

Figure 7A:
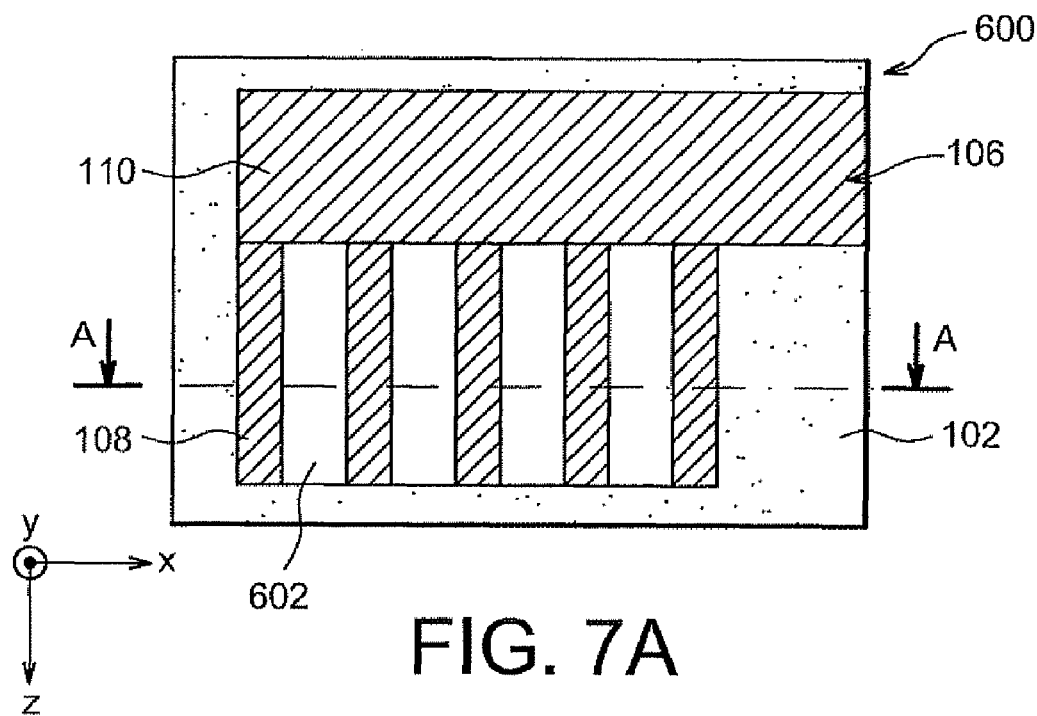
Figure 7B:
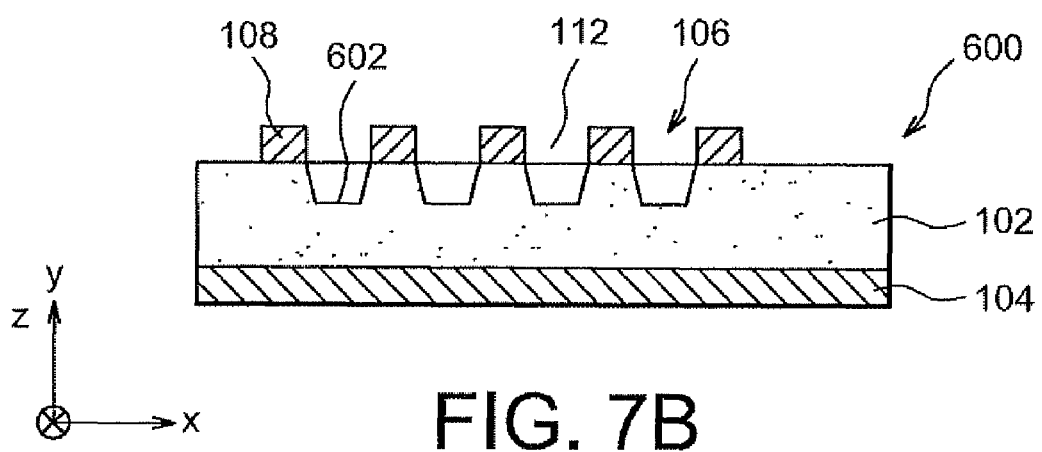

FIGS. 7A and 7B respectively show a top view and a cross-section view according to axis AA shown in FIG. 7R of a resonator 600 comprising inactive etched zones 602. This etching makes it possible to remove the piezoelectric material. This reduces the average relative density of the material at the level of these inactive zones 602. The reduction in the average density of the material modifies the propagation conditions, and in particular, the acoustic impedance and the propagation speed. This results in a significant reduction in the propagation coefficient of these inactive zones. By thus increasing the difference between the propagation coefficient of the active zones and that of the inactive zones, the acoustic energy concentrated in the Lamb waves is increased.

It is possible to perform this etching on the entire surface, in the plane (x, z), of the inactive zones between the fingers 108 as in the example of FIGS. 7A and 7B, or on only a portion (for example, by producing trenches or holes) of these inactive zones.

As an alternative to the embodiments described above, it is also possible for the lower electrode to have a shape and dimensions different from those of the piezoelectric layer 102 (in plane (x, z)) shown in FIG. 2A. In this case, the lower electrode may in particular have a pattern similar to that of the upper electrode, respectively 106, 206, 306, 406 or 506 according to the embodiment, and be arranged so that the active zones of the piezoelectric layer are located only between the fingers of the upper electrode and the fingers of the lower electrode. The other portions of the piezoelectric layer are in contact with only one of the two electrodes.

Figure 8A:
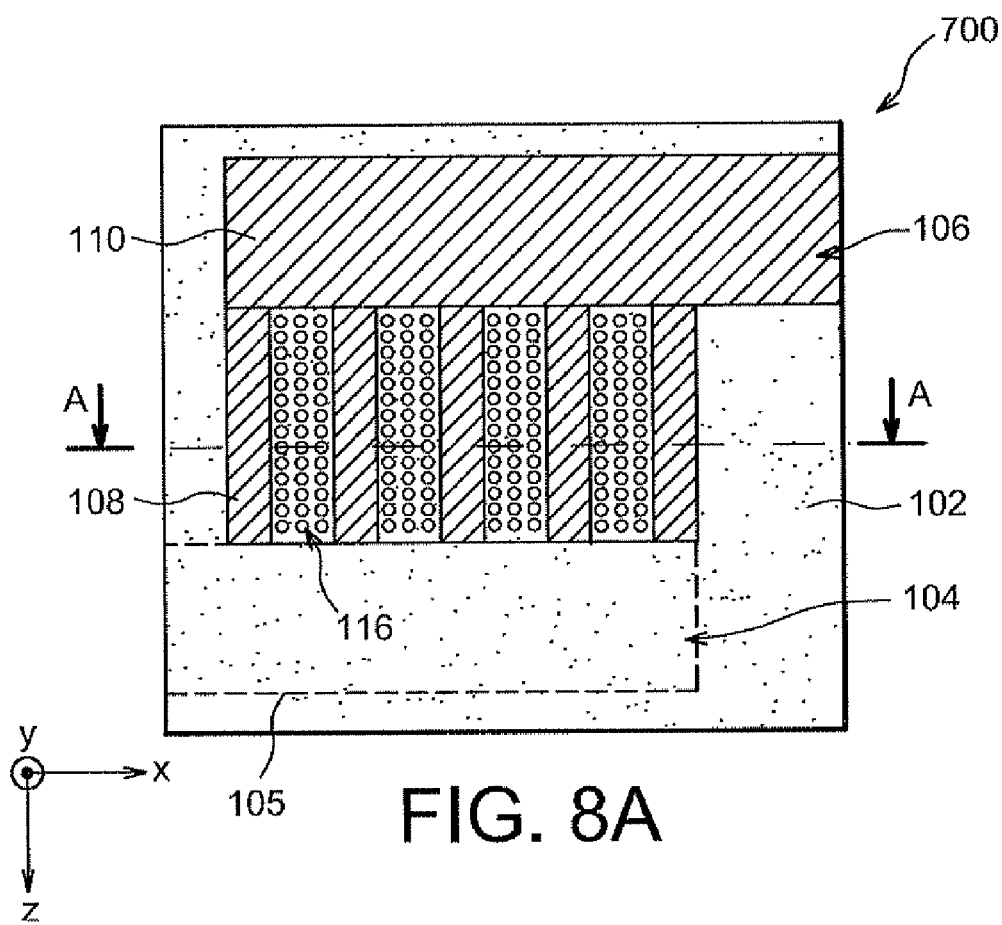
Figure 8B:
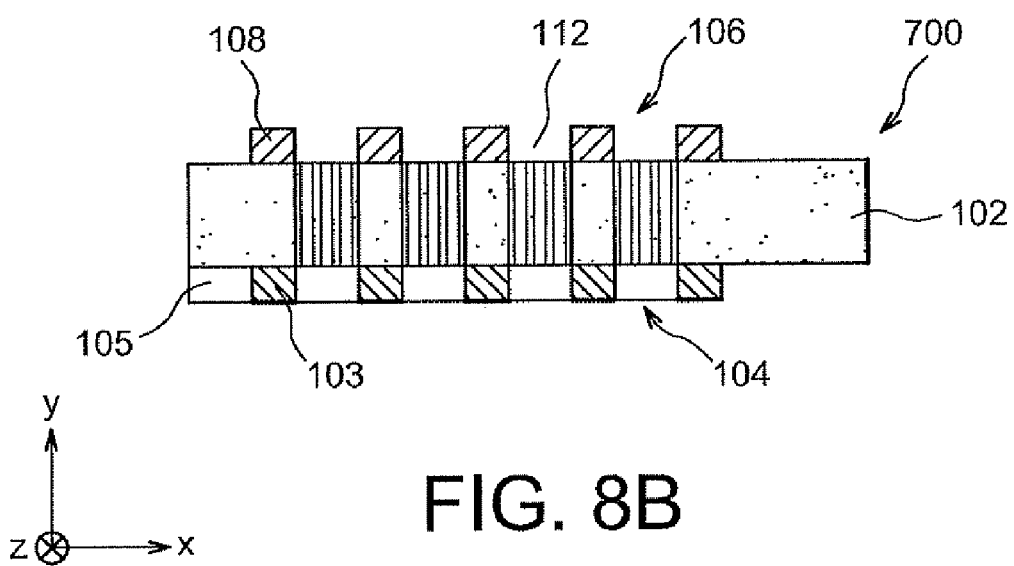

FIGS. 8A and 8B respectively show a top view and a cross-section view according to axis AA shown in FIG. 8A, of a resonator 700 in such an alternative. In FIG. 8A, a contact arm 105 of the lower electrode 104 is shown with a dotted line. Fingers 103 of the lower electrode 104 are shown in FIG. 8B. In these figures, the fingers 108 of the upper electrode 106 are superimposed on the fingers of the lower electrode 104.

This alternative makes it possible in particular to reduce the length of the contact arms of the upper and lower electrodes (dimension according to axis x of FIG. 8B) and to increase the width of these contact arms (dimension according to axis z of FIG. 8A). This reduces the access resistances of the various fingers of the resonator. This also reduces the series resistance of the resonator, for the same resonance frequency as a resonator comprising a lower electrode 104 as described with regard to FIGS. 2A and 2B.

In addition, in this alternative embodiment, the inactive zones of the piezoelectric layer 102 are etched according to a pattern comprising a plurality of through-holes 116. These holes 116 make it possible to reduce the average density of the piezoelectric material of the layer 112, and therefore to modify the conditions of propagation between the active and inactive zones of the piezoelectric layer 102. In plane (x, y), the holes have a diameter dr for example between about 10 μm and 50 μm, so that $d \ll \lambda a$, with $\lambda a$: lateral acoustic wavelength of the Lamb waves, or for example so that $d < (\lambda a/10)$.

That which is claimed is claimed:

1. A lamb wave resonator comprising:
   at least one piezoelectric layer; and
   a first electrode against a first face of said at least one piezoelectric layer and comprising a pattern parallel to a plane of the first face, the pattern comprising a plurality of fingers and a contact arm, each finger comprising a first side in contact with said contact arm and two other sides parallel to one another, and said plurality of fingers being spaced apart from one another by a distance W calculated according to the following equation:

$$W = n \cdot \frac{va_{lateral}}{f}, \text{ with } n \in N$$

where,
$va_{lateral}$ is an acoustic propagation speed of Lamb waves,
n is an order of a resonance mode of the Lamb waves,
f is a resonance frequency of the Lamb wave resonator, and
said at least one piezoelectric layer having at least one recess between said plurality of fingers of said first electrode.

2. The lamb wave resonator according to claim 1, wherein the at least one recess is formed based on a pattern including a plurality of holes.

3. The lamb wave resonator according to claim 1, wherein the at least one recess extends through the at least one piezoelectric layer between said plurality of fingers.

4. The lamb wave resonator according to claim 1, wherein said at least one piezoelectric layer has a second face opposite the first face, and wherein the at least one recess extends through the first face to the second face.

5. The lamb wave resonator according to claim 1, wherein said at least one piezoelectric layer has a second face opposite the first face, and further comprising a second electrode against the second face.

6. The lamb wave resonator according to claim 5, wherein said second electrode comprises, in a plane parallel to the plane of the first face of said at least one piezoelectric layer, a second pattern comprising a plurality of second fingers and a second contact arm, in which a surface of said plurality of second fingers is similar and superimposed on the surface formed by said plurality of fingers of said first electrode in the same plane.

7. The lamb wave resonator according to claim 6, wherein the second pattern of said second electrode is similar to the pattern of said first electrode in the same plane, and a surface of said second contact arm of said second electrode is not superimposed on a surface of said contact arm of said first electrode in the same plane.

8. The lamb wave resonator according to claim 1, wherein a surface of said plurality of fingers of said first electrode is included in a surface formed by said second electrode in the same plane.

9. The lamb wave resonator according to claim 1, wherein each finger of said first electrode is substantially rectangular shaped.

10. The lamb wave resonator according to claim 1, wherein a number of said plurality of fingers of said first electrode is between 2 and 100.

11. The lamb wave resonator according to claim 1, wherein said contact arm of said first electrode is substantially rectangular shaped.

12. The lamb wave resonator according to claim 11, wherein a line parallel to the two sides of each finger of said first electrode, spaced apart from one another by a distance W, is substantially perpendicular to a line passing through a side of said contact arm of said first electrode to which said finger is connected.

13. The resonator according to claim 1, wherein said plurality of fingers of said first electrode are connected to at least one of the following of said contact arm of said first electrode: a single side thereof, two opposite sides thereof, and three sides thereof.

14. The resonator according to claim 1, wherein said contact arm of said first electrode is substantially circular shaped, and wherein said plurality of fingers of said first electrode are connected thereto.

15. A resonator comprising:
    at least one piezoelectric layer; and
    a first electrode against a first face of said at least one piezoelectric layer and comprising a plurality of fingers and a contact arm, each finger comprising a first side in contact with said contact arm and two other sides parallel to one another, and said plurality of fingers being spaced apart from one another by a distance W calculated according to the following equation:

$$W = n \cdot \frac{va_{lateral}}{f}, \text{ with } n \in N$$

where,
$va_{lateral}$ is an acoustic propagation speed of Lamb waves,
n is an order of a resonance mode of the Lamb waves,
f is a resonance frequency of the resonator, and
said at least one piezoelectric layer having at least one recess between said plurality of fingers of said first electrode.

16. The resonator according to claim 15, wherein the at least one recess is formed based on a pattern including a plurality of holes.

17. The resonator according to claim 15, wherein the at least one recess extends through the at least one piezoelectric layer between said plurality of fingers.

18. The resonator according to claim 15, wherein said at least one piezoelectric layer has a second face opposite the first face, and wherein the at least one recess extends through the first face to the second face.

19. The resonator according to claim 15, wherein said at least one piezoelectric layer has a second face opposite the first face, and further comprising a second electrode against the second face.

20. The resonator according to claim 19, wherein a surface of said plurality of fingers of said first electrode is included in a surface formed by said second electrode in the same plane.

21. The resonator according to claim 19, wherein said second electrode comprises a second pattern comprising a plurality of second fingers and a second contact arm, in which a surface of said plurality of second fingers is similar and superimposed on a surface formed by said plurality of fingers of said first electrode in the same plane.

22. The resonator according to claim 21, wherein the second pattern of said second electrode is similar to the pattern of said first electrode in the same plane, and a surface of said second contact arm of said second electrode is not superimposed on a surface of said contact arm of said first electrode in the same plane.

23. A method for producing a Lamb wave resonator comprising:
  forming at least one piezoelectric layer;
  forming a first electrode against a first face of the at least one piezoelectric layer, the first electrode comprising a pattern parallel to a plane of the first face, the pattern comprising a plurality of fingers and a contact arm, each finger comprising a first side in contact with the contact arm and two other sides parallel to one another, and the plurality of fingers being spaced apart from one another by a distance W calculated according to the following equation:

$$W = n \cdot \frac{va_{lateral}}{f}, \text{ with } n \in N$$

where,
  $va_{lateral}$ is an acoustic propagation speed of Lamb waves,
  n is an order of a resonance mode of the Lamb waves,
  f is a resonance frequency of the resonator; and
    etching at least one recess in the at least one piezoelectric layer between the plurality of fingers of the first electrode.

24. The method according to claim 23, wherein the at least one piezoelectric layer is at least partially etched according to a pattern including a plurality of holes.

25. The method according to claim 23, wherein the at least one piezoelectric layer is entirely etched.

26. The method according to claim 23, wherein the at least one piezoelectric layer has a second face opposite the first face, and wherein the portions of the at least one piezoelectric layer are etched through the first face to the second face.

27. The method according to claim 23, wherein the at least one piezoelectric layer has a second face opposite the first face, and further comprising forming a second electrode against the second face.

28. The method according to claim 27, wherein a surface of the plurality of fingers of the first electrode is included in a surface formed by the second electrode in the same plane.

29. The method according to claim 27, wherein the second electrode comprises, in a plane parallel to the plane of the first face of the at least one piezoelectric layer, a second pattern comprising a plurality of second fingers and a second contact arm, in which a surface of the plurality of second fingers is similar and superimposed on the surface formed by the plurality of fingers of the first electrode in the same plane.

30. The method according to claim 29, wherein the second pattern of the second electrode is similar to the pattern of the first electrode in the same plane, and a surface of the second contact arm of the second electrode is not superimposed on a surface of the contact arm of the first electrode in the same plane.

* * * * *